(12) United States Patent
Shajii et al.

(10) Patent No.: US 7,829,353 B2
(45) Date of Patent: Nov. 9, 2010

(54) PULSED MASS FLOW DELIVERY SYSTEM AND METHOD

(75) Inventors: Ali Shajii, Canton, MA (US); Siddharth P. Nagarkatti, Acton, MA (US); Matthew Mark Besen, Andover, MA (US); William R. Clark, Hampstead, NH (US); Daniel Alexander Smith, Andover, MA (US); Bora Akgerman, San Francisco, CA (US)

(73) Assignee: MKS Instruments, Inc., Wilmington, MA (US)

( * ) Notice: Subject to any disclaimer, the term of this patent is extended or adjusted under 35 U.S.C. 154(b) by 451 days.

(21) Appl. No.: 11/586,782

(22) Filed: Oct. 26, 2006

(65) Prior Publication Data

US 2007/0042508 A1 Feb. 22, 2007

Related U.S. Application Data

(62) Division of application No. 10/822,358, filed on Apr. 12, 2004.

(51) Int. Cl.
*H01L 21/00* (2006.01)
(52) U.S. Cl. .............................. 438/5; 438/14; 438/758; 438/761; 438/935; 257/E21.001
(58) Field of Classification Search .................. 438/758, 438/5, 761, 935; 257/E21.24
See application file for complete search history.

(56) References Cited

U.S. PATENT DOCUMENTS

| | | | |
|---|---|---|---|
| 3,572,364 A | 3/1971 | Robens et al. | |
| 4,640,221 A | 2/1987 | Barbee et al. | |
| 4,717,596 A | 1/1988 | Barbee et al. | |
| 4,783,343 A | 11/1988 | Sato | |
| 4,911,101 A | 3/1990 | Ballingall et al. | |

(Continued)

FOREIGN PATENT DOCUMENTS

EP 1316785 4/2003

(Continued)

OTHER PUBLICATIONS

Geankoplis, "Transport Processes and Unit Operations", Third Edition, 1993, Prentice Hall PTR, p. 238.

*Primary Examiner*—Alexander G Ghyka
*Assistant Examiner*—Angel Roman
(74) *Attorney, Agent, or Firm*—McDermott Will & Emery LLP

(57) ABSTRACT

A system for delivering a desired mass of gas, including a chamber, a first valve controlling flow into the chamber, a second valve controlling flow out of the chamber, a pressure transducer connected to the chamber, an input device for providing a desired mass to be delivered, and a controller connected to the valves, the pressure transducer and the input device. The controller is programmed to receive the desired mass from the input device, close the second valve and open the first valve, receive chamber pressure measurements from the pressure transducer, and close the inlet valve when pressure within the chamber reaches a predetermined level. The controller is then programmed to wait a predetermined waiting period to allow the gas inside the chamber to approach a state of equilibrium, then open the outlet valve at time=$t_0$, and close the outlet valve at time=$t^*$ when the mass of gas discharged equals the desired mass.

6 Claims, 7 Drawing Sheets

U.S. PATENT DOCUMENTS

| | | | |
|---|---|---|---|
| 5,225,366 A | 7/1993 | Yoder | |
| 5,281,274 A | 1/1994 | Yoder | |
| 5,394,755 A | 3/1995 | Sudo et al. | |
| 5,500,256 A | 3/1996 | Watabe | |
| 5,565,038 A | 10/1996 | Ashley | |
| 5,684,245 A | 11/1997 | Hinkle | |
| 5,849,092 A | 12/1998 | Xi et al. | |
| 5,865,205 A | 2/1999 | Wilmer | |
| 5,868,159 A | 2/1999 | Loan et al. | |
| 6,062,256 A | 5/2000 | Miller et al. | |
| 6,119,710 A | 9/2000 | Brown | |
| 6,125,869 A | 10/2000 | Horiuchi | |
| 6,193,212 B1 | 2/2001 | Ohmi et al. | |
| 6,503,330 B1 | 1/2003 | Sneh et al. | |
| 6,612,331 B2 | 9/2003 | Cederstav et al. | |
| 6,631,334 B2 | 10/2003 | Grosshart | |
| 6,638,859 B2 | 10/2003 | Sneh et al. | |
| 6,673,323 B1 | 1/2004 | Bhatnagar et al. | |
| 6,782,348 B2 | 8/2004 | Ushiku | |
| 6,812,157 B1 * | 11/2004 | Gadgil | 438/763 |
| 6,820,632 B2 | 11/2004 | Ohmi et al. | |
| 6,911,092 B2 | 6/2005 | Sneh | |
| 6,913,031 B2 | 7/2005 | Nawata et al. | |
| 6,958,277 B2 | 10/2005 | Pomarede et al. | |
| 7,050,708 B2 | 5/2006 | Sandhu | |
| 7,089,134 B2 | 8/2006 | Barros et al. | |
| 7,094,614 B2 | 8/2006 | Armbrust et al. | |
| 7,100,800 B2 * | 9/2006 | Yakasovic Saavedra et al. | 222/3 |
| 7,216,019 B2 | 5/2007 | Tinsley et al. | |
| 7,335,396 B2 | 2/2008 | Carpenter et al. | |
| 7,428,373 B2 | 9/2008 | Sandhu | |
| 7,434,477 B2 | 10/2008 | Lull et al. | |
| 7,474,968 B2 | 1/2009 | Ding et al. | |
| 2002/0007790 A1 | 1/2002 | Park | |
| 2002/0022087 A1 | 2/2002 | Satake et al. | |
| 2002/0094681 A1 | 7/2002 | Armbrust et al. | |
| 2002/0098627 A1 | 7/2002 | Pomarede et al. | |
| 2002/0195145 A1 | 12/2002 | Lowery et al. | |
| 2003/0094136 A1 | 5/2003 | Bartholomew et al. | |
| 2003/0180458 A1 | 9/2003 | Sneh | |
| 2003/0234047 A1 * | 12/2003 | Shajii et al. | 137/487.5 |
| 2004/0015300 A1 * | 1/2004 | Ganguli et al. | 702/24 |
| 2004/0083961 A1 | 5/2004 | Basceri | |
| 2004/0226507 A1 | 11/2004 | Carpenter et al. | |
| 2004/0244837 A1 | 12/2004 | Nawata et al. | |
| 2005/0081786 A1 | 4/2005 | Kubista et al. | |
| 2005/0095859 A1 * | 5/2005 | Chen et al. | 438/689 |
| 2005/0126483 A1 | 6/2005 | Tognetti | |
| 2005/0160983 A1 | 7/2005 | Sneh | |
| 2005/0199342 A1 | 9/2005 | Shajii et al. | |
| 2005/0223979 A1 | 10/2005 | Shajii et al. | |
| 2005/0249876 A1 | 11/2005 | Kawahara et al. | |
| 2006/0130744 A1 | 6/2006 | Clark | |
| 2006/0258078 A1 * | 11/2006 | Lee et al. | 438/216 |
| 2007/0039549 A1 | 2/2007 | Shajii et al. | |

FOREIGN PATENT DOCUMENTS

| | | |
|---|---|---|
| WO | WO/03034169 | 4/2003 |

* cited by examiner

PULSED MASS FLOW DELIVERY SYSTEM AND METHOD

RELATED APPLICATION

This application is a divisional of prior U.S. application Ser. No. 10/822,358, filed 12 Apr. 2004, the contents of which are incorporated in their entirety herein by reference.

FIELD OF THE INVENTION

The present disclosure relates generally to semiconductor manufacturing equipment and, more particularly, to systems and methods for delivering precise quantities of process gases to semiconductor processing chambers. Even more particularly, the present disclosure relates to a system and method for delivering pulsed mass flow of precursor gases into semiconductor processing chambers.

BACKGROUND OF THE DISCLOSURE

The manufacture or fabrication of semiconductor devices often requires the careful synchronization and precisely measured delivery of as many as a dozen gases to a process chamber. Various recipes are used in the manufacturing process, and many discrete processing steps, where a semiconductor device is cleaned, polished, oxidized, masked, etched, doped, metalized, etc., can be required. The steps used, their particular sequence, and the materials involved all contribute to the making of particular devices.

As device sizes continue to shrink below 90 nm, the semiconductor roadmap suggests that atomic layer deposition, or ALD processes will be required for a variety of applications, such as the deposition of barriers for copper interconnects, the creation of tungsten nucleation layers, and the production of highly conducting dielectrics. In the ALD process, two or more precursor gases flow over a wafer surface in a process chamber maintained under vacuum. The two or more precursor gases flow in an alternating manner, or pulses, so that the gases can react with the sites or functional groups on the wafer surface. When all of the available sites are saturated from one of the precursor gases (e.g., gas A), the reaction stops and a purge gas is used to purge the excess precursor molecules from the process chamber. The process is repeated, as the next precursor gas (i.e., gas B) flows over the wafer surface. A cycle is defined as one pulse of precursor A, purge, one pulse of precursor B, and purge. This sequence is repeated until the final thickness is reached. These sequential, self-limiting surface reactions result in one monolayer of deposited film per cycle.

The pulses of precursor gases into the processing chamber is normally controlled using on/off-type valves which are simply opened for a predetermined period of time to deliver a desired amount of precursor gas into the processing chamber. Alternatively, a mass flow controller, which is a self-contained device consisting of a transducer, control valve, and control and signal-processing electronics, is used to deliver repeatable gas flow rate, as opposed to a mass or an amount of gas, in short time intervals. In both cases, the amount of material (mass) flowing into the process chamber is not actually measured.

What is still desired is a new and improved system and method for measuring and delivering pulsed mass flow of precursor gases into semiconductor processing chambers. Preferably, the system and method will actually measure the amount of material (mass) flowing into the process chamber. In addition, the system and method will preferably provide highly repeatable and precise quantities of gaseous mass for use in semiconductor manufacturing processes, such as atomic layer deposition (ALD) processes.

SUMMARY OF THE DISCLOSURE

The present disclosure provides a system for delivering a desired mass of gas. The system includes a chamber, a first valve controlling gas flow into the chamber, a second valve controlling gas flow out of the chamber, a pressure transducer providing measurements of pressure within the chamber, an input device for providing a desired mass of gas to be delivered from the system, and a controller connected to the valves, the pressure transducer and the input device. The controller is programmed to receive the desired mass of gas through the input device, close the second valve and open the first valve, receive chamber pressure measurements from the pressure transducer, and close the inlet valve when pressure within the chamber reaches a predetermined level.

The controller is then programmed to wait a predetermined waiting period to allow the gas inside the chamber to approach a state of equilibrium, open the outlet valve at time=$t_0$, and close the outlet valve at time=$t^*$ when the mass of gas discharged equals the desired mass.

According to one aspect of the present disclosure, the mass discharged $\Delta m$ is equal to $\Delta m = m(t_0) - m(t^*) = V/R[(P(t_0)/T(t_0)) - (P(t^*)/T(t^*))]$, wherein $m(t_0)$ is the mass of the gas in the delivery chamber at time=$t_0$, $m(t^*)$ is the mass of the gas in the delivery chamber at time=$t^*$, V is the volume of the delivery chamber, R is equal to the universal gas constant (8.3145 J/mol K), $P(t_0)$ is the pressure in the chamber at time=$t_0$, $P(t^*)$ is the pressure in the chamber at time=$t^*$, $T(t_0)$ is the temperature in the chamber at time=$t_0$, $T(t^*)$ is the temperature in the chamber at time=$t^*$.

According to another aspect of the present disclosure, the system further includes a temperature probe secured to the delivery chamber and connected to the controller, and the temperature probe provides $T(t_0)$ and $T(t^*)$ directly to the controller.

According to an additional aspect of the present disclosure, the system further includes a temperature probe secured to a wall of the delivery chamber and connected to the controller. $T(t_0)$ and $T(t^*)$ are calculated using $dT/dt = (\rho_{STP}/\rho V)Q_{out}(\gamma - 1)T + (Nu\kappa/l)(A_w/VC_v\rho)(T_w - T)$, where $\rho_{STP}$ is the gas density under standard temperature and pressure (STP) conditions, $\rho$ equals the density of the gas, V is the volume of the chamber, $Q_{out}$ is the gas flow out of the delivery chamber, T equals absolute temperature, $\gamma$ is the ratio of specific heats, Nu is Nusslets number, $\kappa$ is the thermal conductivity of the gas, $C_v$ is the specific heat of the gas under constant volume, l is the characteristic length of the delivery chamber, and $T_w$ is the temperature of the wall of the chamber as provided by the temperature probe.

According to a further aspect of the present disclosure, the gas flow out of the delivery chamber $Q_{out}$ is calculated using $Q_{out} = -(V/\rho_{STP})[(1/RT)(dp/dt) - (P/RT^2)(dT/dt)]$.

Among other aspects and advantages, the present disclosure provides a new and improved system and method for delivering pulsed mass flow of precursor gases into semiconductor processing chambers. The mass flow delivery system and method actually measures the amount of material (mass) flowing into the process chamber. In addition, the system and method provide highly repeatable and precise quantities of gaseous mass for use in semiconductor manufacturing processes, such as atomic layer deposition (ALD) processes.

Additional aspects and advantages of the present disclosure will become readily apparent to those skilled in this art from the following detailed description, wherein an exemplary embodiment of the present disclosure is shown and described, simply by way of illustration. As will be realized, the present disclosure is capable of other and different embodiments and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

Reference is made to the attached drawings, wherein elements having the same reference characters represent like elements throughout, and wherein.

DETAILED DESCRIPTION OF EXEMPLARY EMBODIMENTS

Figure 1:
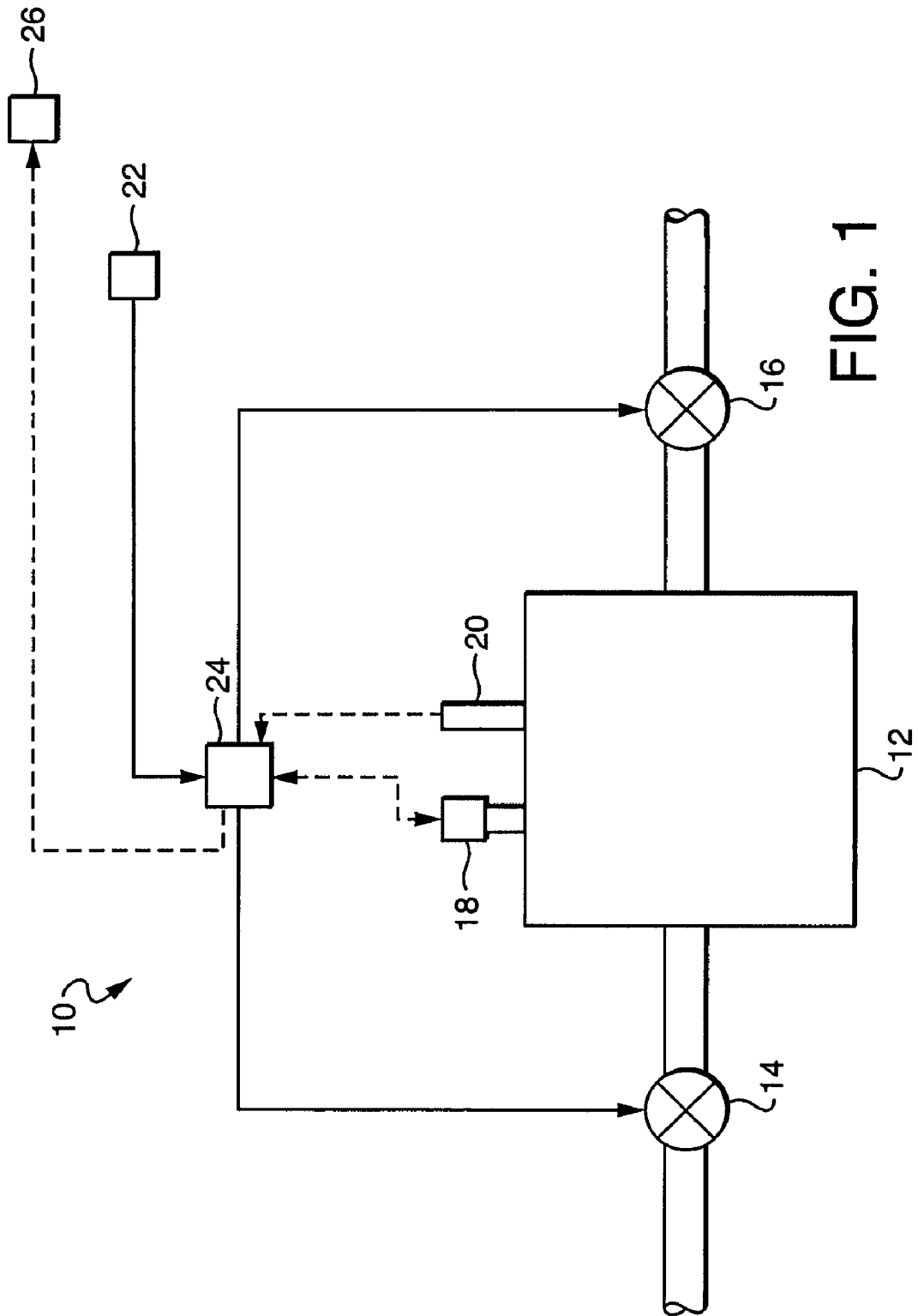
FIG. 1 is a schematic illustration of an exemplary embodiment of a pulsed mass flow delivery system constructed in accordance with the present disclosure.
Figure 2:
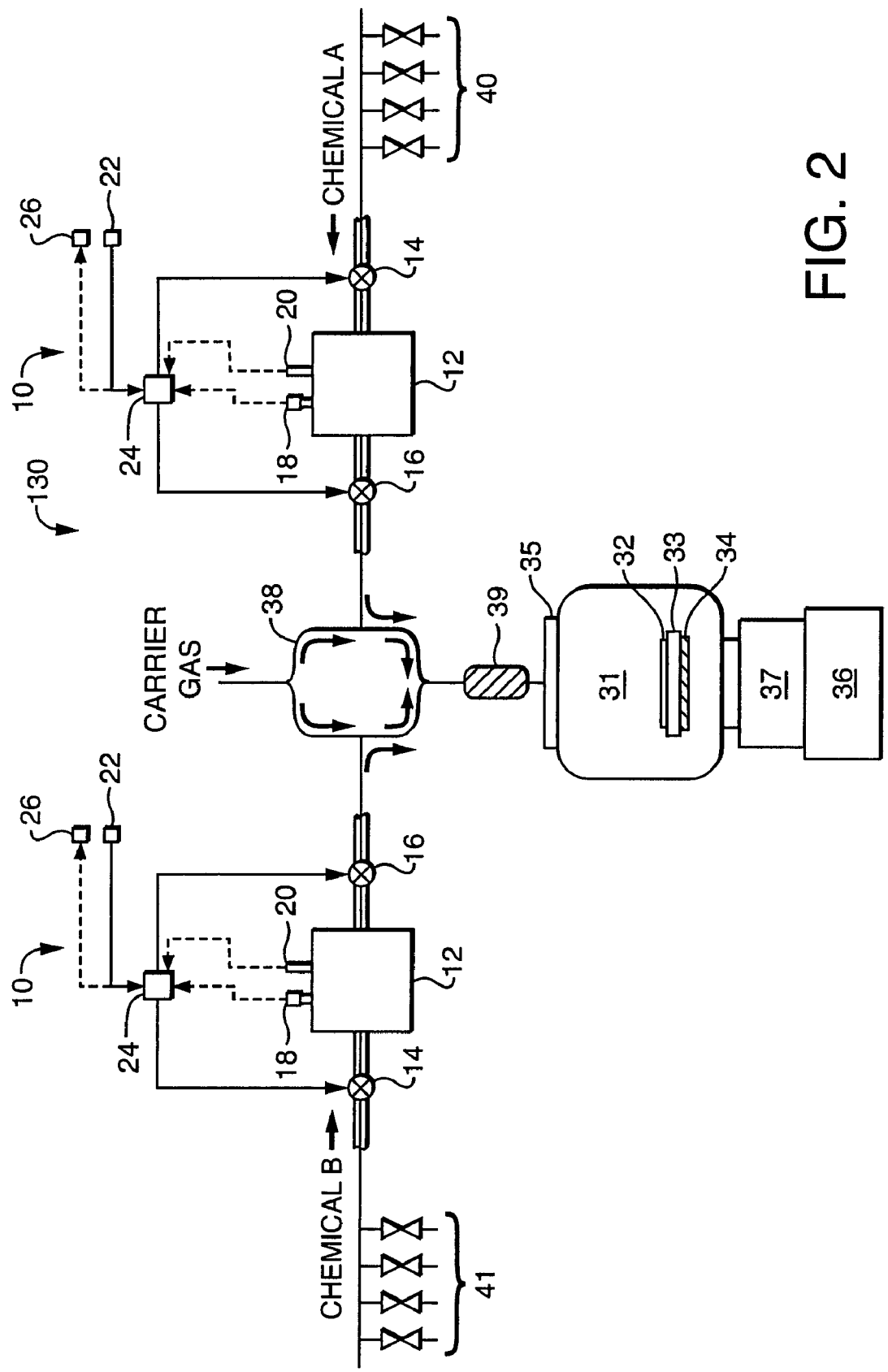
FIG. 2 is a schematic illustration of an exemplary embodiment of an atomic layer deposition system including two of the pulsed mass flow delivery systems of FIG. 1.

Referring to FIG. 1, the present disclosure provides an exemplary embodiment of a mass flow delivery system 10, and, in FIG. 2, the present disclosure provides an exemplary embodiment of a method 100 for delivering mass flow. The system 10 and method 100 are particularly intended for delivering contaminant-free, precisely metered quantities of process gases to semiconductor process chambers. The mass flow delivery system 10 and method 100 actually measure the amount of material (mass) flowing into the process chamber. In addition, the system and method provide highly repeatable and precise quantities of gaseous mass for use in semiconductor manufacturing processes, such as atomic layer deposition (ALD) processes. Prior to describing the system 10 and method 100 of the present disclosure, however, an example of an atomic layer deposition apparatus is first described to provide background information.

Figure 7:
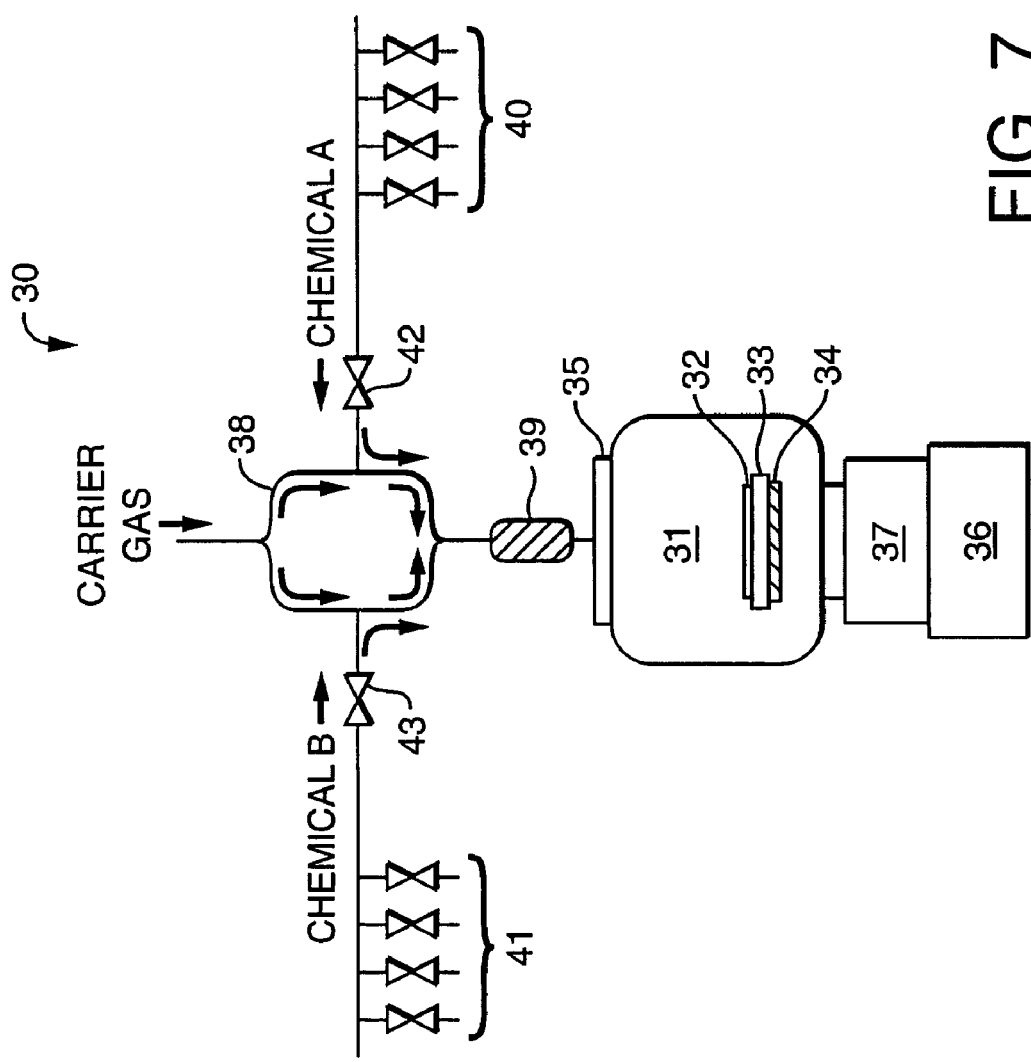
FIG. 7 is a schematic illustration of an exemplary embodiment of an atomic layer deposition system constructed in accordance with the prior art.

FIG. 7 is a schematic illustration of an exemplary embodiment of an atomic layer deposition system 30 constructed in accordance with the prior art. The system 30 includes a processing chamber 31 for housing a semiconductor wafer or substrate 32. Typically, the wafer 32 resides atop a support (or chuck) 33 and a heater 34 is coupled to the chuck to heat the chuck 33 and the wafer 32 for plasma deposition. The processing gases are introduced into the chamber 31 through a gas distributor 35 located at one end of the chamber 31. A vacuum pump 36 and a throttling valve 37 are located at the opposite end to draw gas flow across the wafer surface and regulate the pressure within the process chamber.

The system 30 also includes a mixing manifold 38 for mixing the various processing gases, a plasma forming zone 39 for forming the plasma. A variety of chemical vapor deposition (CVD) techniques for combining gases and forming plasma can be utilized, including adapting techniques known in the art. The remotely formed plasma is then fed into the gas distributor 35 and then into the processing chamber 31.

The mixing manifold 38 has two inlets for the introduction of gases and chemicals. A carrier gas is introduced and the flow split at the mixing manifold 38. The carrier gas is typically an inert gas, such as nitrogen. The mixing manifold 38 also has two inlets for the chemicals. In the example diagram of FIG. 7, chemical A and chemical B are shown combined with the carrier gas. Chemistry A pertains to a first precursor gas and chemistry B pertains to a second precursor gas for performing atomic layer deposition on the semiconductor wafer 32 contained in the process chamber 31. Chemical selection manifolds 40 and 41, comprised of a number of regulated valves, provide for the selecting of chemicals that can be used as precursor gases A and B, respectively. On/off-type valves 42 and 43 respectively regulate the introduction of the precursor gases A and B into the mixing manifold 38.

Once the wafer 32 is resident within the processing chamber 31, the chamber environment is brought up to meet desired parameters. For example, raising the temperature of the semiconductor wafer 32 in order to perform atomic layer deposition. The flow of carrier gas is turned on so that there is a constant regulated flow of the carrier gas as the gas is drawn by the vacuum created by the pump 36. When atomic layer deposition is to be performed, valve 42 is opened to allow the first precursor to be introduced into the carrier gas flow. After a preselected time, valve 42 is closed and the carrier gas purges any remaining reactive species from the process chamber 31. Then, the valve 43 is opened to introduce the second precursor into the carrier gas flow. Again after another preselected time, the valve 43 is closed and the carrier gas purges the reactive species from the process chamber 31. The two chemicals A and B are alternately introduced into the carrier flow stream to perform the atomic layer deposition cycle to deposit a film layer on the semiconductor wafer 32.

Thus, the pulses of precursor gases into the processing chamber 31 are controlled using the on/off type valves 42 and 43 which are simply opened for a predetermined period of time to deliver a desired amount of precursor gas into the processing chamber 31. Alternatively, mass flow controllers, which are self-contained devices consisting of a transducer, control valve, and control and signal-processing electronics, can be used in place of the on/off type valves 42 and 43 to deliver repeatable gas flow rates in timed intervals to the processing chamber 31. In both cases, the amount of material (mass) flowing into the process chamber is not actually measured. Instead flow rates are controlled to estimate the mass flow. The mass flow delivery system 10 and method 100 of the present disclosure, however, actually measure the amount of material (mass) flowing into the process chamber as opposed to controlling flow rates to estimate mass flow.

Referring again to FIG. 1, the presently disclosed mass flow delivery system 10 includes a delivery chamber 12, a first valve 14 controlling mass flow into the chamber 12, and a second valve 16 controlling mass flow out of the chamber 12. According to one exemplary embodiment of the present disclosure, the first and the second valves 14, 16 comprise on/off type valves, and at least the second or outlet valve 16 has a relatively very fast response time of about 1 to 5 milliseconds, for example.

The mass flow delivery system 10 also has a pressure transducer 18 for providing measurements of pressure within the chamber 12 and a temperature sensor 20 for providing measurements of temperature on or within the chamber 12. The pressure transducer 18 also has a relatively very fast response time of about 1 to 5 milliseconds, for example. According to one exemplary embodiment of the present disclosure, the temperature sensor 20 is in contact with, and provides measurements of the temperature of, a wall of the chamber 12.

Examples of a suitable pressure transducer 18 for use with the delivery system 10 of the present disclosure are Baratron® brand pressure transducers available from the assignee of the present disclosure, MKS Instruments of Andover, Mass. (http://www.mksinst.com). Suitable valves 14, 16 are also available from the assignee.

An input device 22 of the mass flow delivery system 10 receives a desired mass flow (either directly from a human operator or indirectly through a wafer processing computer controller), and a computer controller (i.e., computer processing unit or "CPU") 24 is connected to the pressure transducer 18, the temperature sensor 20, the valves 14, 16 and the input device 22. The input device 22 can also be used to input other processing instructions. An output device 26 is connected to the controller 24 and provides an indication (either directly from a human operator or indirectly through a wafer processing computer controller) of the mass delivered by the system 10. The input and the output devices 22, 26 may be combined into a single unit, such as a personal computer with a keyboard and monitor.

As shown in FIG. 2, an atomic layer deposition system 130 including two of the mass flow delivery systems 10 of FIG. 1 can be provided. The atomic layer deposition system 130 is similar to the prior art atomic layer deposition system 30 of FIG. 7, such that similar elements share the same reference numerals. The atomic layer deposition system 130 of FIG. 2, however, includes two of the mass flow delivery systems 10 of FIG. 1 for respectively regulating the introduction of the precursor gases A and B into the mixing manifold 38.

Figure 3:
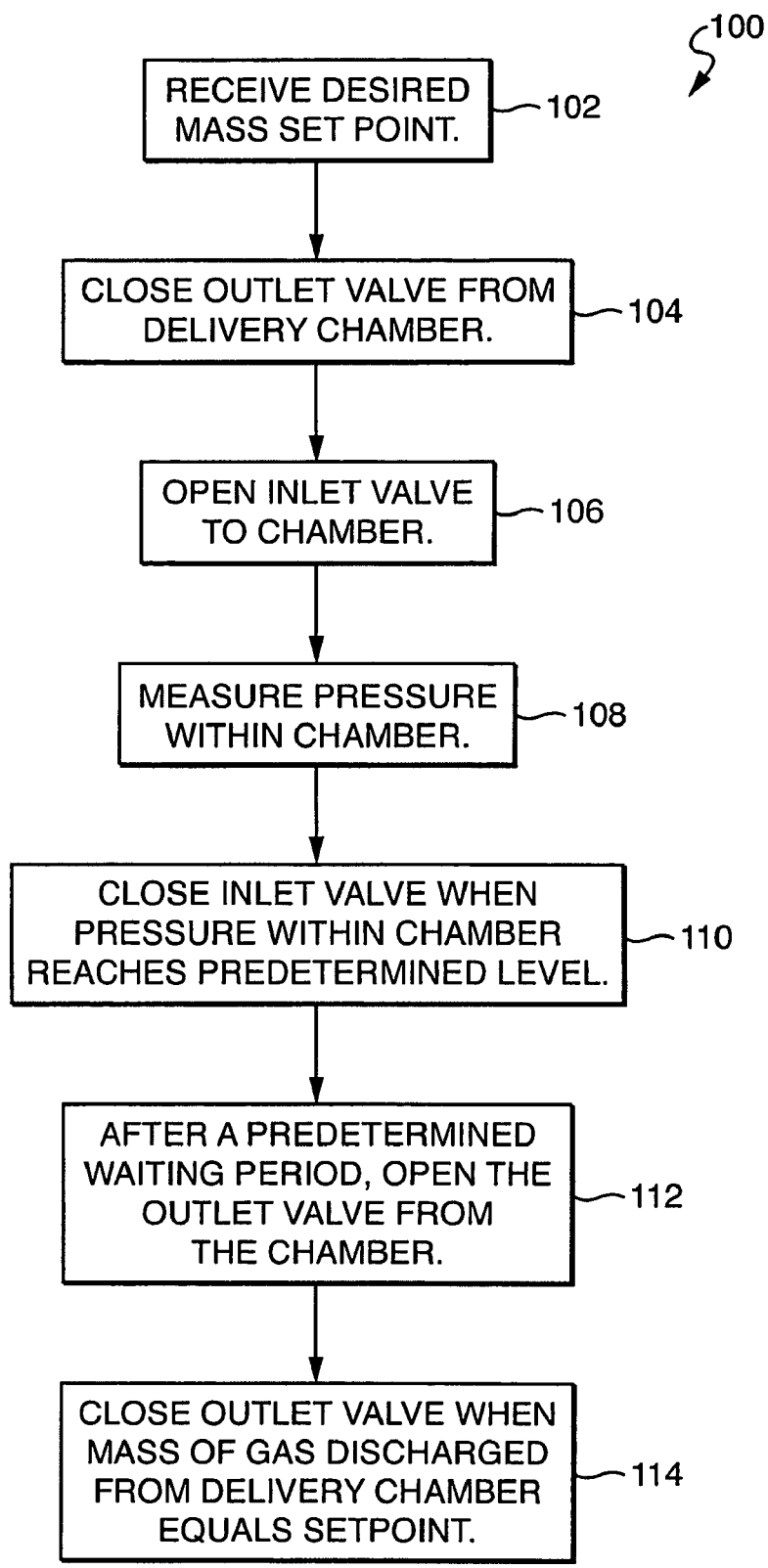
FIG. 3 is a flow chart illustrating an exemplary embodiment of a method for delivering pulsed mass flows in accordance with the present disclosure, wherein the method can be used to operate the pulsed mass flow delivery system of FIG. 1.

According to one exemplary embodiment of the disclosure, the controller 24 of the mass flow delivery systems 10 of FIG. 1 carries out the method 100 of FIG. 3. Referring to FIGS. 1 and 3, the controller 24 is programmed to receive the desired mass flow (i.e., setpoint) through the input device 22, as shown at 102 of FIG. 3, close the outlet valve 16, as shown at 104 of FIG. 3, open the first or inlet valve 14 to the chamber 12, as shown at 106 of FIG. 3, measure pressure within the chamber using the pressure transducer 18, as shown at 108 of FIG. 3, and close the inlet valve 14 when pressure within the chamber 12 reaches a predetermined level, as shown at 110 of FIG. 3. The predetermined level of pressure is user defined and can be provided through the input device 22. The predetermined level of pressure can comprise, for example, 200 torr.

After a predetermined waiting period, wherein the gas inside the chamber 12 can approach a state of equilibrium, the outlet valve 16 is opened to discharge a mass of gas from the chamber 12, as shown at 112 of FIG. 3. The predetermined waiting period is user defined and can be provided through the input device 22. The predetermined waiting period can comprise, for example, 3 seconds. The outlet valve 16 is then closed when the mass of gas discharged equals the user defined desired mass flow, as shown at 114 of FIG. 3. The outlet valve 16 is opened for only a very short period (e.g., 100 to 500 milliseconds). The controller 24 then provides the mass of gas discharged to the output device 26.

For high pressure applications, the temperature of the gas within the delivery chamber 12 of the system 10 can be measured using the temperature probe 20. For low pressure applications and fast temperature transients, however, using a probe to measure the temperature may not be fast enough for accurate readings. In the case of low pressure applications and fast temperature transients a real-time physical model that estimates gas temperature is used, as described below.

The total mass m in the delivery chamber 12 based on the ideal gas law is:

$$m = \rho V = (P/RT)V \quad (1)$$

Where $\rho$ equals density, V equals volume, P equals absolute pressure, T equals absolute temperature, and R is equal to the universal gas constant (8.3145 J/mol K).

The density dynamics within the delivery chamber 12 is:

$$d\rho/dt = -(Q_{out}\rho_{STP}/V) \quad (2)$$

Where $Q_{out}$ is the flow out of the delivery chamber 12, and $\rho_{STP}$ is the gas density under standard temperature and pressure (STP) conditions.

The Temperature dynamics within the delivery chamber 12 is:

$$dT/dt = (\rho_{STP}/\rho V)Q_{out}(\gamma - 1)T + (Nu\kappa/l)(A_w/VC_v\rho)(T_w - T) \quad (3)$$

Where $\gamma$ is the ratio of specific heats, Nu is Nusslets number, $\kappa$ is the thermal conductivity of the gas, $C_v$ is the specific heat under constant volume, l is the characteristic length of the delivery chamber, and $T_w$ is the temperature of the wall of the chamber 12 as provided by the temperature probe 20.

The outlet flow $Q_{out}$ can be estimated as follows:

$$Q_{out} = -(V/\rho_{STP})[(1/RT)(dp/dt) - (P/RT^2)(dT/dt)] \quad (4)$$

To compute the total mass delivered $\Delta m$ from the chamber 12, equation (4) is substituted for $Q_{out}$ in equation (3) to calculate the gas temperature T(t), at time=t, within the chamber 12, as opposed to using the temperature probe 20 in FIG. 1. The pressure transducer 18 provides the pressure P(t), at time=t, within the chamber 12.

The total mass delivered $\Delta m$ from the chamber 12 between time $t_0$ and time t* is:

$$\Delta m = m(t_0) - m(t^*) = V/R[(P(t_0)/T(t_0)) - (P(t^*)/T(t^*))] \quad (5)$$

Figure 4:
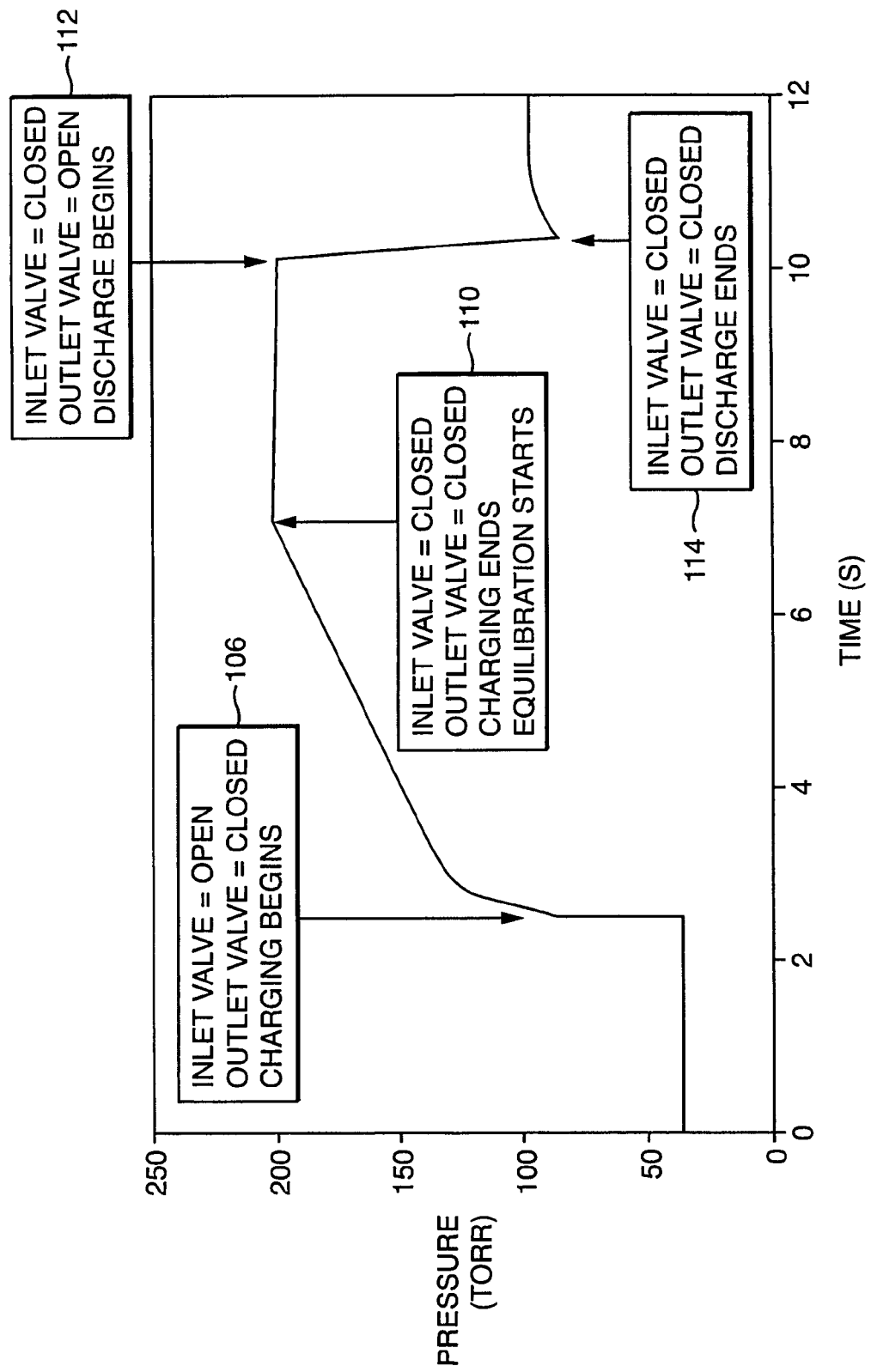
FIG. 4 is a graph of pressure within a chamber of the system of FIG. 1 versus time, as the method of FIG. 3 is conducted.
Figure 5:
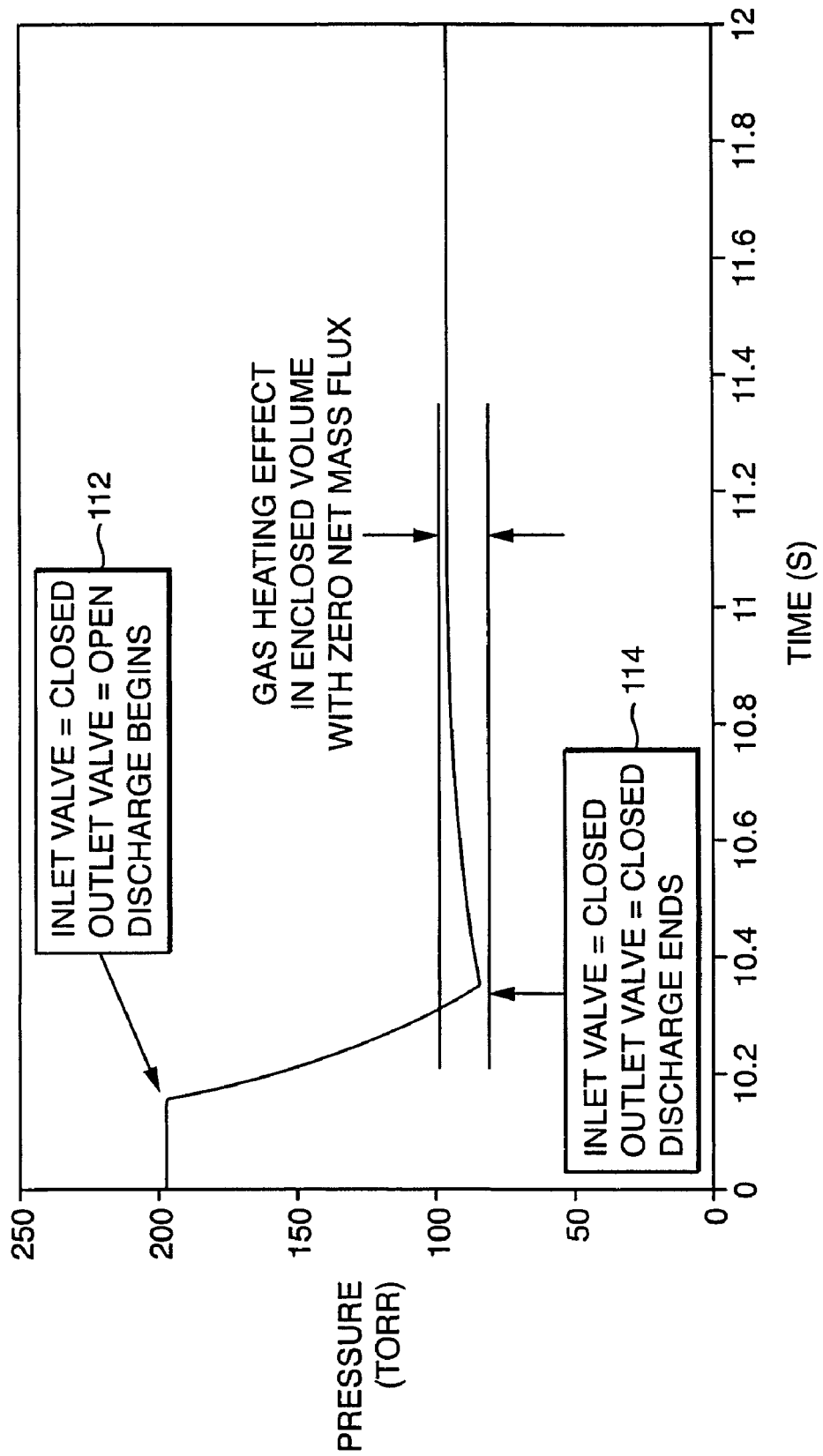
FIG. 5 is a graph of pressure within the chamber of the system of FIG. 1 versus time, after the method of FIG. 3 is completed.
Figure 6:
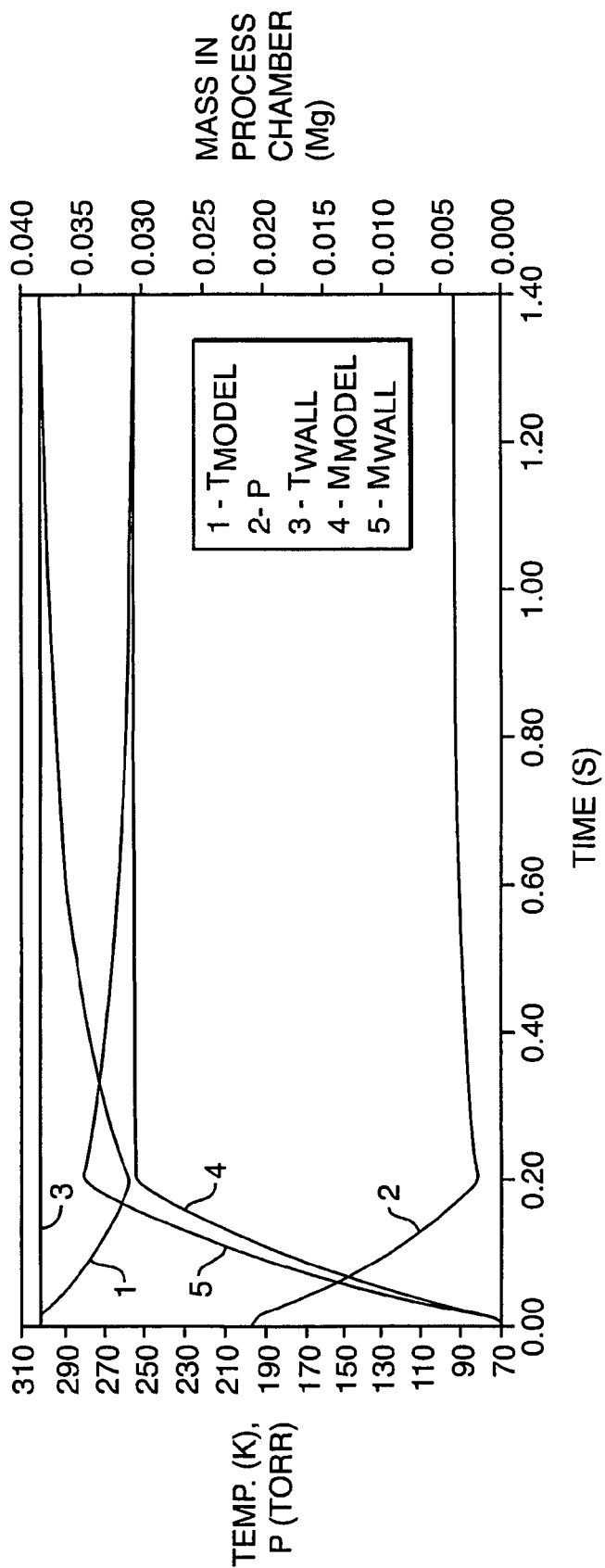
FIG. 6 is a graph of actual pressure, temperature and mass, and modeled temperature and mass within the chamber of the system of FIG. 1 versus time, as the method of FIG. 3 is conducted.

FIG. 4 is a graph of pressure P(t) within the chamber 12 of the system 10 of FIG. 1 versus time, as the method 100 of FIG. 3 is conducted. FIG. 5 is a graph of pressure within the chamber 12 of the system 10 of FIG. 1 versus time, after the method 100 of FIG. 3 is completed, and illustrates that the chamber pressure P(t) increases slightly and stabilizes after the outlet valve 16 is closed. FIG. 6 is a graph of calculated or actual properties within the chamber 12 of the system 10 of FIG. 1 versus time, as the method 100 of FIG. 3 is conducted. In particular, the graph of FIG. 6 includes a calculated or model temperature "$T_{model}$" as calculated using equation (3); an actual pressure "P" within the chamber 12 as provided by the pressure transducer 18; an actual temperature of the wall "$T_{wall}$" of the chamber 12 as provide by the temperature probe 20; a mass $M_{model}$ of the gas delivered from the delivery chamber 12 as calculated using equation (5) with the model temperature "$T_{model}$" provided by equation (3); and a mass $M_{wall}$ of the gas delivered from the delivery chamber 12 as calculated using equation (5) with the wall temperature "$T_{wall}$" provided by temperature probe 20.

Among other aspects and advantages, the present disclosure provides a new and improved system and method for delivering pulsed mass flow of precursor gases into semiconductor processing chambers. The mass flow delivery system and method actually measures the amount of material (mass)

flowing into the process chamber. In addition, the system and method provide highly repeatable and precise quantities of gaseous mass for use in semiconductor manufacturing processes, such as atomic layer deposition (ALD) processes.

The exemplary embodiments described in this specification have been presented by way of illustration rather than limitation, and various modifications, combinations and substitutions may be effected by those skilled in the art without departure either in spirit or scope from this disclosure in its broader aspects and as set forth in the appended claims.

What is claimed is:

1. A method of repeatedly delivering pulses of metered quantities of a precursor gas to a semiconductor processing chamber, comprising:
   repeatedly delivering pulses of precisely metered quantities of the precursor gas from an output valve of a delivery chamber, each pulse of a desired predetermined mass, to the semiconductor process chamber; wherein repeatedly delivering the pulses includes measuring the mass of each pulse of gas as each pulse is delivered to the semiconductor process chamber and wherein measuring the mass of each pulse includes calculating a value of the total mass delivered in real-time while the output valve of the delivery chamber is open and as a function of temperature and pressure within the delivery chamber; and
   prior to delivering each respective pulse, waiting a predetermined period to allow the gas inside the delivery chamber to approach a state of equilibrium.

2. A method according to claim 1, further including repeatedly delivering pulses of precisely metered quantities of at least two precursor gases, wherein the metered quantity of each pulse is measured as the respective pulse of gas is being delivered to the semiconductor process chamber.

3. A method according to claim 1, wherein the mass delivered from the delivery chamber, $\Delta m$, at time $t^*$ is calculated according to, $$\Delta m = m(t_0) - m(t^*) = (V/R)[(P(t_0)/T(t_0)) - (P(t^*)/T(t^*))]$$

wherein $m(t_0)$ is the mass of the gas in the delivery chamber at time=$t_0$ when the gas inside the delivery chamber is at a state of equilibrium, $m(t^*)$ is the mass of the gas in the delivery chamber at time=$t^*$, V is the volume of the delivery chamber, R is equal to the ideal gas constant (J/Kg K), $P(t_0)$ is the pressure in the delivery chamber at time=$t_0$, $P(t^*)$ is the pressure in the delivery chamber at time=$t^*$, $T(t_0)$ is the temperature in the delivery chamber at time=$t_0$, and $T(t^*)$ is the temperature in the delivery chamber at time=$t^*$.

4. A method of repeatedly delivering pulses of metered quantities of a precursor gas to a semiconductor processing chamber, comprising:
   (a) accumulating the gas within a delivery chamber until the pressure within the chamber reaches a predetermined level;
   (b) waiting a predetermined waiting period to allow the gas within the delivery chamber to approach a state of equilibrium; and
   (c) measuring the mass of the gas as it flows from an outlet valve of the delivery chamber to the semiconductor processing chamber so that a precise metered amount of gas is delivered to the semiconductor processing chamber and wherein measuring the mass of gas includes calculating in real-time a value of the total mass delivered when the output valve of the delivery chamber is open and as a function of temperature and pressure within the delivery chamber.

5. A method according to claim 4, wherein (a)-(c) are repeated so that pulses of at least two precursor gases are repeatedly delivered to the semiconductor processing chamber.

6. A method according to claim 4, wherein the mass delivered from the delivery chamber, $\Delta m$, at time $t^*$ is calculated according to, $$\Delta m = m(t_0) - m(t^*) = (V/R)[(P(t_0)/T(t_0)) - (P(t^*)/T(t^*))]$$

wherein $m(t_0)$ is the mass of the gas in the delivery chamber at time=$t_0$ when the gas inside the delivery chamber is at a state of equilibrium, $m(t^*)$ is the mass of the gas in the delivery chamber at time=$t^*$, V is the volume of the delivery chamber, R is equal to the ideal gas constant (J/Kg K), $P(t_0)$ is the pressure in the delivery chamber at time=$t_0$, $P(t^*)$ is the pressure in the delivery chamber at time=$t^*$, $T(t_0)$ is the temperature in the delivery chamber at time=$t_0$, and $T(t^*)$ is the temperature in the delivery chamber at time=$t^*$.

* * * * *